(12) United States Patent
Hausmann et al.

(10) Patent No.: US 12,008,165 B2
(45) Date of Patent: Jun. 11, 2024

(54) OPERATING ELEMENT, HAVING AN OPERATING SURFACE AND A VIBRATION ACTUATOR FOR PRODUCING A LOCALLY DEFINED VIBRATION AT THE OPERATING SURFACE

(71) Applicant: MARQUARDT GMBH, Rietheim-Weilheim (DE)

(72) Inventors: Alexander Hausmann, Bad Dürrheim (DE); Siegbert Gaiser, Rangendingen (DE); Andreas Schwarzkopf, Villingen (DE)

(73) Assignee: MARQUARDT GMBH, Rietheim-Weilheim (DE)

( * ) Notice: Subject to any disclaimer, the term of this patent is extended or adjusted under 35 U.S.C. 154(b) by 33 days.

(21) Appl. No.: 17/763,411

(22) PCT Filed: May 7, 2021

(86) PCT No.: PCT/EP2021/062099
§ 371 (c)(1),
(2) Date: Aug. 29, 2022

(87) PCT Pub. No.: WO2022/002466
PCT Pub. Date: Jan. 6, 2022

(65) Prior Publication Data
US 2022/0374082 A1 Nov. 24, 2022

(30) Foreign Application Priority Data
Jun. 30, 2020 (DE) ...................... 10 2020 117 200.1

(51) Int. Cl.
*G06F 3/01* (2006.01)
(52) U.S. Cl.
CPC .................... *G06F 3/016* (2013.01)

(58) Field of Classification Search
CPC ....................................................... G06F 3/016
See application file for complete search history.

(56) References Cited

U.S. PATENT DOCUMENTS

2002/0149561 A1* 10/2002 Fukumoto ........... G06F 3/04886
345/156
2005/0225539 A1* 10/2005 Prados ................... B60K 35/00
345/173

(Continued)

FOREIGN PATENT DOCUMENTS

| KR | 20210140980 A | * 11/2021 | ............. G06F 3/016 |
| WO | WO-2020078600 A1 | 4/2020 | |
| WO | WO-2020229000 A1 | 11/2020 | |

OTHER PUBLICATIONS

International Search Report and Written Opinion of the International Search Authority, issued in PCT/EP2021/062099, mailed Jul. 19, 2021; ISA/EP.

*Primary Examiner* — Chico A Foxx
(74) *Attorney, Agent, or Firm* — Harness, Dickey & Pierce, P.L.C.

(57) ABSTRACT

A control element (1) has a control panel (2) on a front side and a rear surface (3) on a rear side of the control element situated opposite the front side. The control element has a vibration actuator (4) operatively connected to a locally limited portion (5) of the control panel (2). Thus, a touch detected by a sensor on the locally limited portion (5) of the control panel (2) triggers a vibration of the vibration actuator (4). The vibration actuator (4) is connected indirectly, via a lever element (7), to the rear surface (3) on the rear side of the control panel (2). The lever element (7) transmits a vibration of the vibration actuator (4) to the rear surface (3) of the control element in the area of the locally limited portion (5) of the front side of the control panel (2).

9 Claims, 2 Drawing Sheets

(56) References Cited

U.S. PATENT DOCUMENTS

| | | | |
|---|---|---|---|
| 2010/0045612 A1* | 2/2010 | Molne | G06F 3/016 345/173 |
| 2010/0245254 A1* | 9/2010 | Olien | G06F 1/1626 345/173 |
| 2011/0169742 A1* | 7/2011 | Lipton | H10N 30/302 156/290 |
| 2014/0214206 A1* | 7/2014 | Steinberg | B25J 13/025 700/258 |
| 2017/0097680 A1* | 4/2017 | Keller | G06F 3/016 |
| 2017/0293359 A1* | 10/2017 | Ikuta | B60K 37/06 |
| 2020/0139817 A1* | 5/2020 | Trapp | B60L 53/31 |
| 2020/0149561 A1 | 5/2020 | Hughes et al. | |
| 2020/0338982 A1* | 10/2020 | Mueller | G06F 3/041 |
| 2022/0197462 A1* | 6/2022 | Kemppinen | G06F 3/0412 |
| 2022/0276725 A1* | 9/2022 | Tapti | G06F 3/0393 |
| 2023/0113215 A1* | 4/2023 | Bodenstein | G06F 3/016 701/36 |
| 2023/0367531 A1* | 11/2023 | Shinmen | H04R 3/04 |

\* cited by examiner

OPERATING ELEMENT, HAVING AN OPERATING SURFACE AND A VIBRATION ACTUATOR FOR PRODUCING A LOCALLY DEFINED VIBRATION AT THE OPERATING SURFACE

CROSS-REFERENCE TO RELATED APPLICATIONS

This application is a 371 U.S. National Phase of International Application No. PCT/EP2021/062099, filed May 7, 2021, which claims priority to German Patent Application No. 102020117200.1, filed Jun. 30, 2020. The entire disclosures of the above applications are incorporated herein by reference.

DESCRIPTION

The disclosure relates to a control element with a control panel and a vibration actuator to generate a locally defined vibration on the control panel.

It is known from the prior art to equip control panels with haptic feedback through vibration. For example, a successful entry on the control panel can be confirmed as positive feedback. For this purpose, a vibration actuator is usually attached directly to the component forming the control panel. For example, a housing part or cover plate.

The vibration of the vibration actuator has a diffuse effect on the control panel. Thus, the vibration is not applied to any clearly defined input surface. This results in vibration feedback that extends beyond areas and is independent of the input surface. This is particularly problematic when a plurality of input points are arranged next to one another in the control panel and the vibration acts diffusely over an undefined area.

SUMMARY

It is therefore an object of the disclosure to provide a control element whose control panel supplies precisely defined vibration feedback in a specified portion of the control panel.

This object is achieved by a control element with a control panel on a front side and a rear surface on a rear side of the control element situated opposite the front side. The control element comprises a vibration actuator operatively connected to a locally limited portion of the control panel. Thus, a touch detected by a sensor on the locally limited portion of the control panel triggers a vibration of the vibration actuator. The vibration actuator is connected indirectly, via a lever element, to the rear surface on the rear side of the control panel. The lever element transmits a vibration of the vibration actuator to the rear surface of the control element in the area of the locally limited portion of the front side of the control panel. The lever element includes a contact portion that rests against the rear side of the control panel in the locally limited portion of the control panel. The lever element has a geometric dimension that corresponds to the locally limited portion of the control panel. The lever element includes a holding portion where the vibration actuator is held on the lever element. The holding portion of the lever element is arranged to swing freely relative to the rear surface of the control element.

According to the disclosure, a control element includes a control panel on a front side and a rear surface on a rear side of the control element. The rear surface is situated opposite the front side. The control element has a vibration actuator that is operatively connected to a locally limited portion of the control panel. Thus, a touch in the locally limited portion of the control panel, is detected by a sensor system that triggers a vibration of the vibration actuator. The locally limited portion forms a man-machine interface. Capacitive sensors, known in the art, are used as sensors in this case, for example. In the case of the control element, the vibration actuator is connected indirectly, via a lever element, to the rear surface on the rear side of the control panel. The lever element transmits a vibration of the vibration actuator to the rear surface of the control element precisely in the area of the localized portion of the front side of the control panel.

Use of the lever element causes the vibration actuator to be decoupled from the component providing the control panel. The vibration actuator does not vibrate directly, but rather indirectly via the lever element on the locally limited portion that is provided for the haptic feedback. In this case, the vibration is first transmitted from the lever element, on the rear side to the rear surface of the component forming the control panel, and then through the component to the control panel.

Actuators that are known in the art can be used as vibration actuators. The actuators exert vibrations with a stroke of 2-5 mm and a force of 10 N, for example.

In one embodiment of the control element, the lever element has a contact portion that is designed to rest against the rear side of the control panel in the locally limited portion of the control panel. It has a geometric dimension that corresponds to the locally limited portion of the control panel. For example, if the locally limited portion has a square shape, the contact portion will also have a corresponding square shape.

In one refinement of the control element, the contact portion is secured to lie flat against the rear side of the locally limited portion of the control panel. Thus, the entire contact portion transmits the vibration of the vibration actuator to the entire locally limited portion of the control panel.

In the case of the control element in one advantageous embodiment, the vibration actuator is spaced apart from the rear surface on the rear side. A vibration of the vibration actuator acts directly exclusively on the lever element. The vibration generated by the vibration actuator therefore does not occur on the rear surface, but rather directly on the lever element, from which it is transmitted to the rear surface.

In another embodiment, the control element lever element has a holding portion where the vibration actuator is fastenably held. The lever element thus acts simultaneously as a holder for the vibration actuator. It is also advantageous that the vibrations generated by the vibration actuator radiate in a predefined manner only to the lever element and do not affect other components. Thus, noise is eliminated from an undefined vibration of components that are not intended to vibrate.

In a further embodiment according to the disclosure, the control element holding portion of the lever element is arranged to swing freely relative to the rear side of the control element. The oscillation amplitude can be adjusted as a function of the selected elasticity of the material for the lever element. However, it is ensured that the vibration of the vibration actuator can be picked up by the lever element and transmitted to the component providing the control panel. The holding portion preferably has a free end and is unattached.

To ensure favorable introduction of the vibration into the lever element, the vibration actuator is secured to lie flat against the lever element.

In one refinement of the control element a cover plate is on its front side that forms the control panel. The cover plate is designed to have no joints. This means that the locally limited portion of the control panel is uninterrupted, seamless and jointless, and has a continuous surface.

In an additional embodiment of the control element, the holding portion extends parallel at a distance from the rear side of the control element. In an alternative embodiment the holding portion extend perpendicularly to the rear side of the control element. Thus, the position of the holding portion can be adjusted depending on the available installation space adjacent to the rear surface.

DRAWINGS

The drawings described herein are for illustrative purposes only of selected embodiments and not all possible implementations, and are not intended to limit the scope of the present disclosure.

Other advantageous refinements of the disclosure are characterized in the subclaims and/or depicted in greater detail below together with the description of the preferred embodiment of the disclosure with reference to the figures. In the drawing:

DETAILED DESCRIPTION

The figures are schematic examples and show a control element 1 in a side view and top view. For example it is illustrated in the form of a paneling part with integrated action buttons as a man-machine interface that transmit haptic feedback to the user when used. The electronics and sensors required for this can be selected from the prior art. For instance, a capacitive sensor is used.

Figure 1:
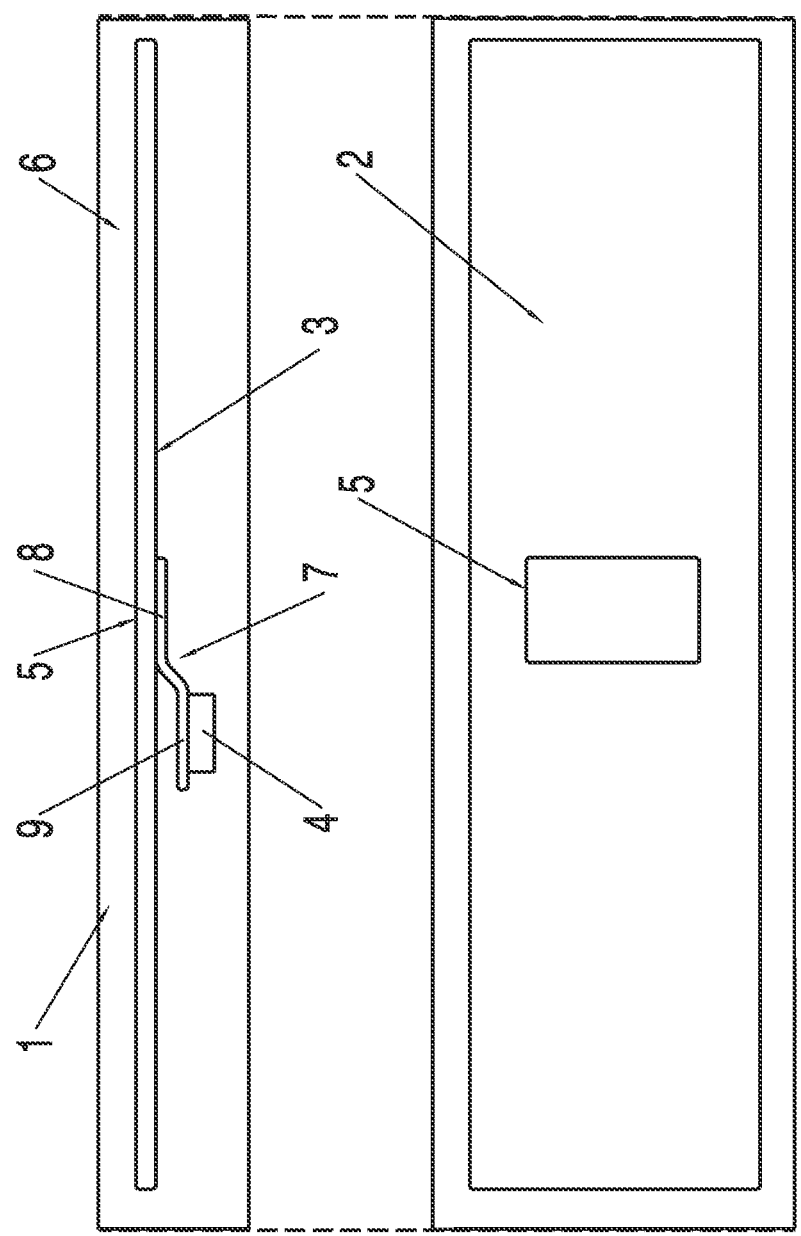
FIG. 1 is a schematic side and top view of a first exemplary embodiment of a control element.
Figure 2:
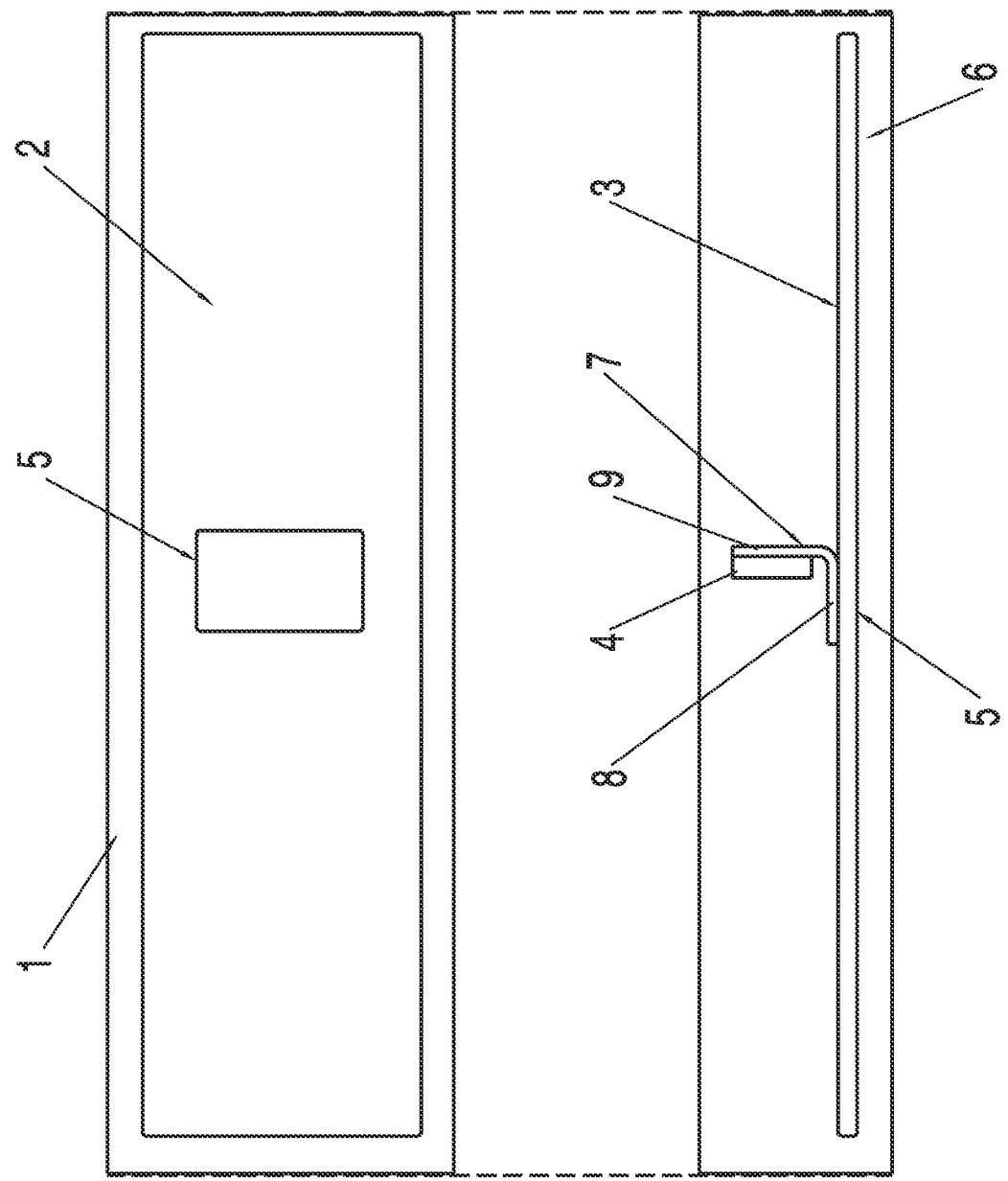
FIG. 2 is a schematic side and top view of a second exemplary embodiment of a control element.

In the exemplary embodiments according to FIG. 1 and FIG. 2, the control element 1 has the control panel 2 on a front side and the rear surface 3 on the oppositely situated rear side. The front side usually corresponds to the visible side of the control element 1. The control panel 2 is formed, for example, by a continuous, seamless, jointless cover plate 6 with the locally limited portion 5. The locally limited portion 5 serves as a function key and the use of which is associated with a vibration feedback. For this purpose, the control element 1 has a vibration actuator 4 on the rear side (not visible from the front side) that is operatively connected via a lever element 7 to the locally limited portion 5 of the control panel 2. Thus, a touch of the locally limited portion 5 of the control panel detected by the sensors control panel 2 triggers a vibration of the vibration actuator 4. The vibration is transmitted, via the lever element 7, to the rear surface 3. From the rear surface 3 the vibration is transmitting to the locally limited portion 5 of the control panel 2, where the vibration can be haptically detected.

The lever element 7 has a contact portion 8 that is geometrically shaped in exactly the same way as the locally limited portion 5 of the control panel 2. The locally limited portion 5 of the control panel 2 is shown as a rectangle for the sake of example, however, any geometric shape can be implemented. The contact portion lies directly and flat against the rear surface 3. Thus, the vibration can be felt in a precise and locally limited manner only in the locally limited portion 5 of the control panel 2. The lever element 7 is fastened, for example glued, to the rear surface 3 via the contact portion 8.

The lever element 7 is integrally formed and, in addition to the contact portion 8, has a holding portion 9 where the vibration actuator 4 is held to lie flat, for example by screwing. The holding portion 9 of the lever element 7 is spaced apart from the rear surface 3 and can vibrate freely. Thus, the vibrations of the vibration actuator 4 act exclusively on the holding portion 9 and are transmitted only indirectly, via the lever element 7, to the rear surface 3 and hence to the control panel 2 in the locally limited portion 5.

In the exemplary embodiment according to FIG. 1, the lever element 7 extends essentially parallel to the rear surface 3. The holding portion 9 is separated from the contact portion 8 by a step of the lever element 7. It has a Z-shape when viewed from the side. This ensures the spacing between the holding portion 9 and the rear surface and the free mobility of the holding portion 9.

In FIG. 2, the holding portion 9 extends perpendicularly to the rear surface 3 on the rear side of the control element 1. The lever element 7 thus forms a 90-degree deflection between the contact portion 8 and the holding portion 9 for the vibration actuator 4. In addition to the 90-degree deflection shown, other angles can of course also be implemented depending on how the adjoining installation space is designed.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A control element has a control panel on a front side and a rear surface on a rear side of the control element situated opposite the front side, the control element comprises:

a vibration actuator operatively connected to a locally limited portion of the control panel so that a touch detected by a sensor on the locally limited portion of the control panel triggers a vibration of the vibration actuator;

the vibration actuator is connected indirectly, via a lever element, to the rear surface on the rear side of the control element, the lever element transmits a vibration of the vibration actuator to the rear surface of the control element in the area of the locally limited portion of the front side of the control panel;

the lever element includes a contact portion that rests against the rear side of the control panel in the locally limited portion of the control panel and the lever element has a geometric dimension that corresponds to the locally limited portion of the control panel;

the lever element includes a holding portion where the vibration actuator is held on the lever element, the holding portion of the lever element is arranged to swing freely relative to the rear surface of the control element.

2. The control element according to claim 1, wherein the contact portion is secured to lie flat against the rear surface of the control element in association with the locally limited portion of the control panel.

3. The control element according to claim 1, wherein the vibration actuator is spaced apart from the rear surface on the rear side, and vibration of the vibration actuator acts directly exclusively on the lever element.

4. The control element according to claim 1 wherein the vibration actuator lies flat against the lever element.

5. The control element according to claim 1, wherein the control element includes a cover plate on its front side that forms the control panel, the cover plate is seamless so that the locally limited portion of the control panel is continuous.

6. The control element according to claim 1, wherein the holding portion extends parallel and at a distance from the rear side of the control element.

7. The control element according to claim 1, wherein the rear portion extends perpendicular to the rear side of the control element.

8. The control element according to claim 1, wherein the holding portion extends parallel and at a distance from the rear side of the control element.

9. The control element according to claim 1, wherein the rear portion extends perpendicular to the rear side of the control element.

* * * * *